United States Patent
Coman et al.

[11] Patent Number: 6,148,039
[45] Date of Patent: Nov. 14, 2000

[54] SYSTEM AND METHOD FOR HARMONIC INTERFERENCE AVOIDANCE IN CARRIER RECOVERY FOR DIGITAL DEMODULATION

[75] Inventors: Ion Coman, Milpitas, Calif.; Kenneth M. Hanna, Lawrenceville, Ga.

[73] Assignee: Scientific-Atlanta, Inc., Norcross, Ga.

[21] Appl. No.: 09/016,763

[22] Filed: Jan. 30, 1998

Related U.S. Application Data

[60] Provisional application No. 60/036,769, Jan. 31, 1997, abandoned.

[51] Int. Cl.$^7$ ............................................. H04L 27/227
[52] U.S. Cl. .................... 375/326; 375/325; 375/327; 455/260; 455/265; 455/180.3; 331/17; 331/25; 331/34
[58] Field of Search .................... 455/180.3, 260, 455/265; 375/327, 376; 331/17, 25, 34; 327/156

[56] References Cited

U.S. PATENT DOCUMENTS

| | | | |
|---|---|---|---|
| 4,000,476 | 12/1976 | Walker et al. | 331/17 |
| 4,042,884 | 8/1977 | Querry | 329/307 |
| 4,246,546 | 1/1981 | McDonald | 331/4 |
| 4,545,072 | 10/1985 | Skutta et al. | 455/183.2 |
| 4,568,888 | 2/1986 | Kimura et al. | 331/10 |
| 4,590,440 | 5/1986 | Haque et al. | 331/17 |
| 4,613,825 | 9/1986 | Bickley et al. | 331/4 |
| 4,718,117 | 1/1988 | Ma et al. | 455/314 |
| 4,761,825 | 8/1988 | Ma | 455/183.2 |
| 4,764,730 | 8/1988 | Miyo et al. | 329/307 |
| 4,866,395 | 9/1989 | Hostetter | 329/309 |
| 4,876,739 | 10/1989 | Ma et al. | 455/266 |
| 4,910,467 | 3/1990 | Leitch | 329/306 |
| 4,910,800 | 3/1990 | Chung | 455/316 |
| 4,944,025 | 7/1990 | Gehring et al. | 455/207 |
| 5,042,052 | 8/1991 | Roberts et al. | 375/344 |
| 5,184,092 | 2/1993 | Shahriary et al. | 331/16 |
| 5,325,401 | 6/1994 | Halik et al. | 375/329 |
| 5,335,354 | 8/1994 | Koike | 455/192.2 |
| 5,355,098 | 10/1994 | Iwasaki | 331/14 |
| 5,471,661 | 11/1995 | Atkinson | 455/165.1 |
| 5,490,176 | 2/1996 | Peltier | 375/325 |
| 5,670,913 | 9/1997 | Palancar | 331/4 |
| 5,699,385 | 12/1997 | D'Sylva et al. | 375/344 |

*Primary Examiner*—Stephen Chin
*Assistant Examiner*—Paul N Rupert
*Attorney, Agent, or Firm*—Kenneth M. Massaroni; Kelly A. Gardner; Hubert J. Barnhardt

[57] ABSTRACT

The present invention relates to an improved demodulator for locking onto and tracking a carrier. Harmonic frequencies are occasionally generated by demodulation circuitry. When this occurs, the harmonic frequencies can interfere with the demodulator's locking and tracking functions, especially if the harmonic frequencies are near a down converted carrier's frequency. A system and method are disclosed which provides an offset to a frequency synthesizer whose output frequency is used to down convert the carrier. The offset alters the frequency of the down converted carrier so as to shift it away from the interfering harmonics. In this regard, the demodulator is enabled to lock onto and track a carrier when previously not possible.

16 Claims, 4 Drawing Sheets

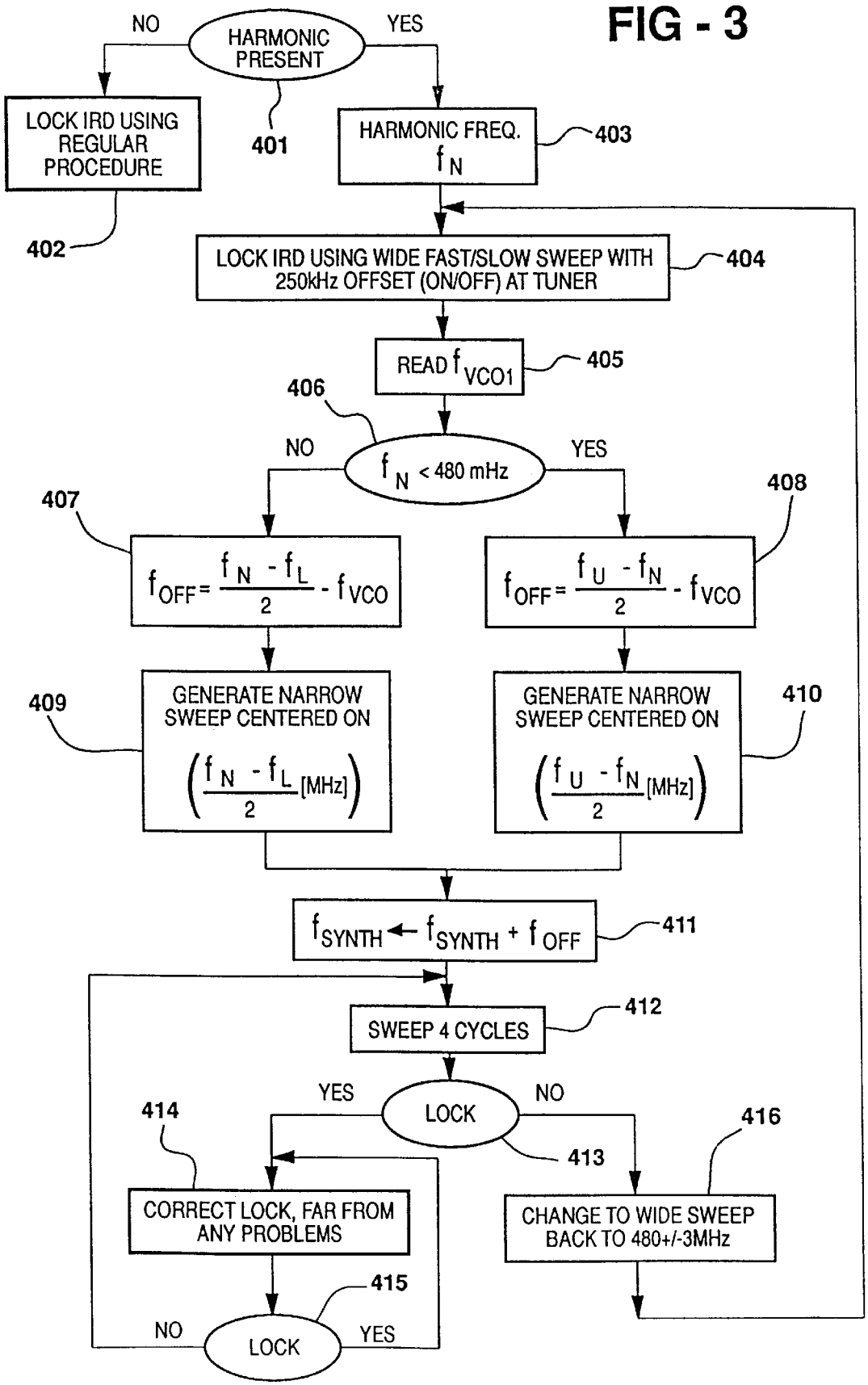

SYSTEM AND METHOD FOR HARMONIC INTERFERENCE AVOIDANCE IN CARRIER RECOVERY FOR DIGITAL DEMODULATION

CROSS REFERENCE TO RELATED APPLICATION

Applicants claim the benefit, under 35 U.S.C. §120, of previously filed co-pending provisional patent application Serial No. 60/036,769, filed Jan. 31, 1997, now abandoned.

BACKGROUND OF INVENTION

1. Technical Field

This invention described herein relates generally to the demodulation of digital signals. More particularly, the invention described herein relates to controlling a down conversion frequency to account for harmonics resident in a demodulator.

2. Related Art

Demodulation is a widely used process to make very high frequencies usable. One of the carrier recovery techniques in digital demodulation is based on the presence of a VCO (Voltage Controlled Oscillator) in the recovery loop. The VCO performs two functions: first, it searches for the carrier frequency in a procedure called a "frequency sweep" and second it tracks the carrier once the recovery loop locks. This is important as the frequency offset that it tracks might be up to +/−5 MHz. This frequency drift is mostly caused by low noise amplifier drift (LNA) or by other frequency conversion stages.

In real systems, the problem of a form of detrimental interference arises. One form of detrimental interference includes harmonic interference, also referred to as "harmonics". Harmonics are generally spectral components of a first signal which can interfere with carrier recovery in a carrier recovery loop. In particular, a major problem is the chance that oscillator harmonics are present in the neighborhood of a VCO. If the harmonics fall within the capture/tracking range of the carrier recovery loop, there is a chance that (due to coupling) the VCO will become disturbed and either fail to lock or break lock once acquired. Measurements show that this interference could cause from 1 to 5 dB SNR loss. Specifically, this interference may be high enough in some cases to make the acquisition impossible (if the IF carrier falls over the harmonic) or to desynchronize the demodulator or the error correction stages following the demodulator (e.g., FEC decoding) (if tracking pulls the VCO frequency over the harmonic) especially when operating in a noisy channel. This problem also occurs in carrier recovery loops that do not include superheterodyning processes.

While increasing the operating specifications of devices used in circuit through the use of higher grade components or employing additional shielding around noisy components (via, for example, a metal shield or can enclosing the noisy device) may reduce the occurrence of detrimental harmonics, these steps fail to accommodate for the existence of the harmonics in sensitive frequency bands, whose mere occurrence may have detrimental effects. Accordingly, a solution is needed which accommodates real world harmonics while making the carrier recovery easioy accomplished, even when operating in a noisy channel.

SUMMARY OF THE INVENTION

The present invention overcomes the aforementioned problems as it minimizes the effects of harmonics in sensitive frequency bands. The disclosed system is useful in satellite receiver and cable television receivers which require the recovery of a carrier signal.

The system and method disclosed herein solves the problems of interference by various harmonics by locking onto a down converted carrier, and if no lock, then by locking on to an offset version of the down converted carrier. Next, the system and method relocates the down converted carrier to a new location on the swept frequency band, far away from the harmonic and other degrading frequencies (for example, the role off frequency of a SAW filter). By employing the disclosed invention, a demodulator will function properly even in the presence of degrading harmonics.

BRIEF DESCRIPTION OF THE DRAWINGS

The present invention will now be described in more detail with reference to preferred embodiments of the invention, given only by way of example, and illustrated in the accompanying drawings in which:

FIG. 3 shows a flowchart as contemplated by embodiments of the present invention.

DETAILED DESCRIPTION

The present invention is discussed below with reference to the recovery of digital signals. It understood that the invention is readily applied to the recovery of other non-digital signals as well.

Figure 1:
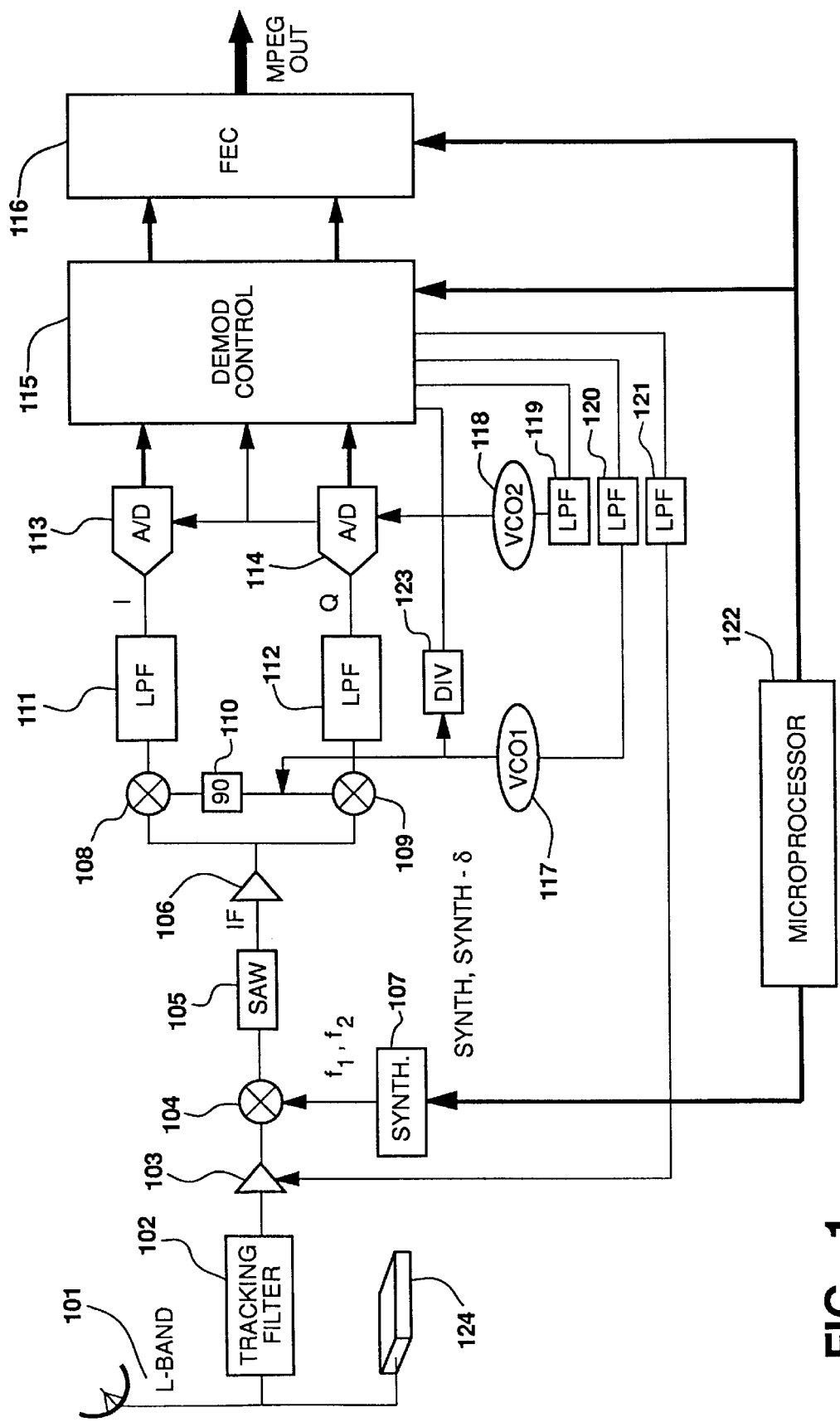
FIG. 1 shows a first hardware environment of the present invention.

FIG. 1 shows a block diagram of different components as contemplated by the present invention. An L-band RF signal 101 with digital information encoded therein is received from a modulated source (for example, a satellite LHA) and filtered by a tracking filter 102. Also, additional inputs of a modulated source include digital cable distribution systems. Also, in alternative embodiments, non-digital inputs are received as well including from analog television systems as well as from radio transmission systems. These systems are only given as examples. The application of the invention described herein is contemplated for a variety of uses where harmonic signals exist and need to be accommodated.

The output of the tracking filter 102 is fed through controlled amplifier 103. Controlled amplifier is controlled by demodulation control 115 for automatic gain control purposes. The output of controlled amplifier is fed into mixer 104 where it is down converted into an intermediate frequency (IF). Mixer 104 uses a signal output from synthesizer 107. As shown in FIG. 1, the output of synthesizer 107 is controlled to be a set frequency. Here, synthesizer 107 is controlled to output a signal at a first frequency and, upon control from microprocessor 122, output the signal at a second frequency. For simplicity, the two frequencies are referred to as $f_{synth}$ and $f_{synth}-\delta_f$ where $\delta_f$ is an offset which changes the output of synthesizer 107. For example, $\delta_f$ may be 250 kHz. To control synthesizer 107, microprocessor 122 outputs one of at least two control signals to program synthesizer 107 to SYNTH, and SYNTH-DELTA. In response, synthesizer 107 outputs at least two signals with base frequencies of $f_{synth}$ and $f_{synth}-\delta_f$ as explained in greater detail below.

Next, the output from mixer 104 is passed through standing acoustical wave (SAW) filter 105 where the IF signal is filtered to remove unwanted characteristics. Finally, IF signal is passed through amplifier 106 and then to a baseband processing system.

Baseband processing system contains a number of different sub-circuits. The output from amplifier 106 is split into two paths I and Q, where I represents the in-phase component of the IF signal and Q represents the quadrature component of the IF signal. Referring first to the I path, IF signal is mixed at mixer 108 with a 90 degrees shifted output from voltage controlled oscillator 117 (VCO1). The phase shift is accomplished by phase shifter 110. The output from mixer 108 is passed through low pass filter (LPF) 111, through A/D converter 113, then to demodulation control 115. The path of Q is similar to that of I, using mixer 109, LPF 112, and A/D converter 114. The output of demodulation control 115 is fed into forward error correction circuit 116 and output as a desired signal. For example, the desired signal output is contemplated to be an MPEG output signal.

Once the system locks onto the carrier frequency $F_{lock-int}$, demodulation controller 115 evaluates the frequency $F_{lock-int}$ using the pre-scaled signal from VCO1 through DIV 123 to determine how close the VCO1 frequency is from the harmonic.

Next, the microprocessor changes the frequency of the synthesizer 107 with the offset value which will cause carrier recovery lock at a frequency between the harmonic and the limit where the filtering (SAW or baseband) starts degrading the spectrum of the signal.

The sweep signal is enabled thereafter but with a much smaller amplitude as the system knows approximately where the frequency $F_{final-lock}$ is. In particular, the narrow sweep only has to be wider than the synthesizer step. In this way, the acquisition at the new frequency $F_{lock-final}$ is done much faster then the initial one at $F_{lock-int}$.

Demodulation controller 115 performs match filtering and outputs a variety of control signals. Match filtering relates to inter symbol interference filtering which demodulates a received signal to recover the modulated data. In operation, the demodulation controller 115 outputs an automatic gain control signal, passed through LPF 121, which controls amplifier 103, discussed above. Second, demodulation control 115 outputs a carrier recovery loop signal, passed through LPF 120, for VCO1 117. Finally, demodulation control 115 outputs symbol recovery signal, passed through LPF 119, for VCO2 118 so as to enable A/D converters 113 and 114 to know when each symbol to be decoded starts. To assist in the carrier recovery loop, the demodulation controller uses divider DIV 123 to provide a scaled-down version of the frequency output from VCO1 117. This scaled-down version of the frequency allows the demodulation controller 115 to closely monitor the sweeping cycle of the VCO1. As described in greater detail below, once the output frequency of VCO1 reaches the maximum or minimum frequency of its sweeping frequency range, the demodulation controller 115 controls the output of VCO1 to conform to its predetermined sweeping scheme.

In this example, the most prevalent harmonic arises from this loop including VCO2 118. It is this harmonic for which the present invention accounts. However, other harmonics exist as well and are, likewise, avoided. Further, harmonics may arise from external locations (for example, from a timing circuit in another microprocessor). Embodiments of the present invention further contemplate avoiding these additional harmonics as well.

In addition to controlling synthesizer 107, microprocessor 122 also controls demodulation control 115 and forward error correction 116.

Turning attention to the carrier recovery loop including VCO1, the carrier recovery circuitry performs two main functions: it searches for a down-converted carrier frequency through a procedure referred to as "frequency sweep" and it tracks the carrier once the recovery loop locks. As to the tracking function, the carrier recovery circuitry is enabled to track frequency drifts up to +/−5 MHz. These drifts are mostly caused by low noise amplifier (LNA) drift.

Figure 2:
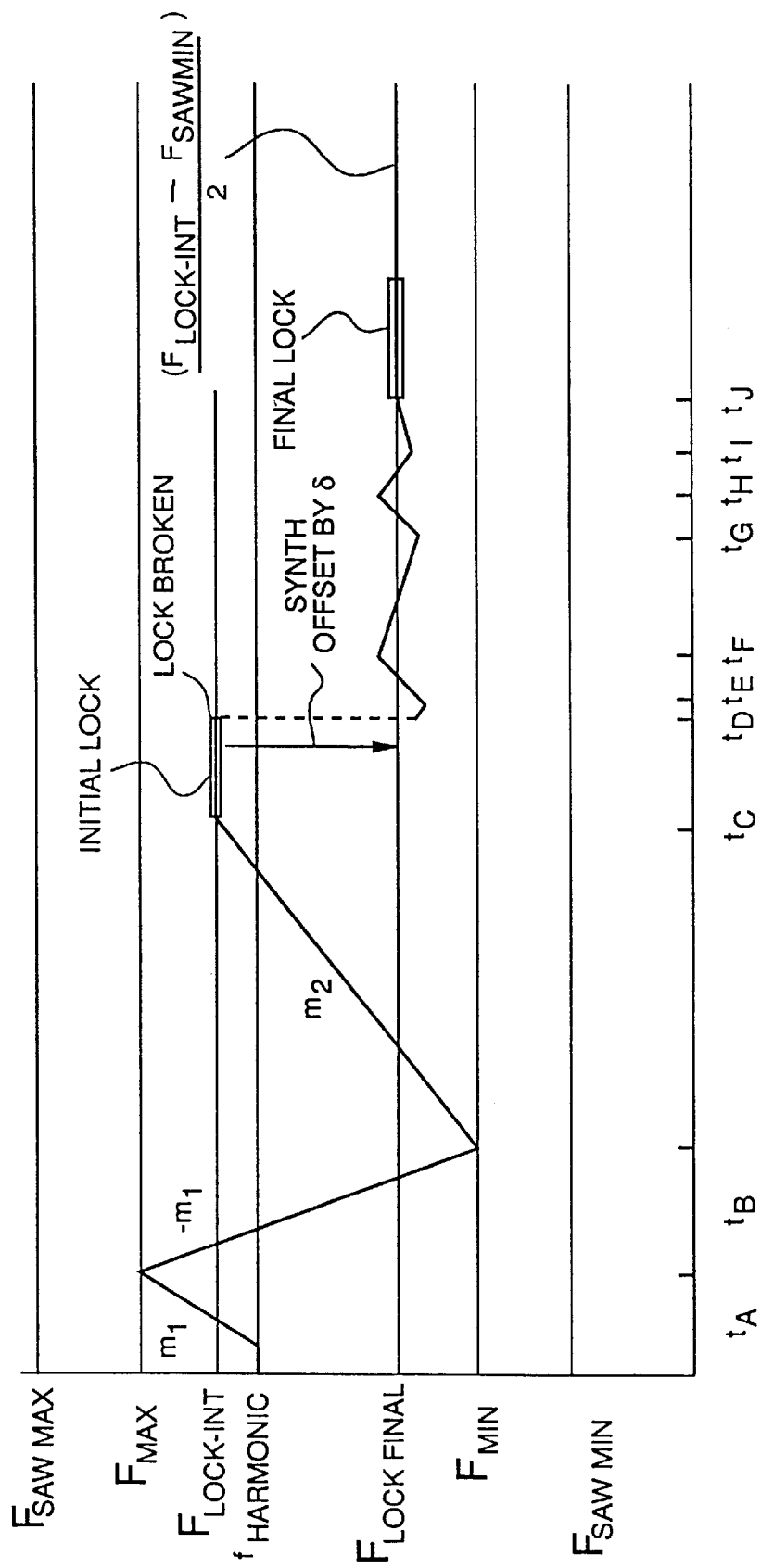
FIG. 2 shows the carrier recovery loop locking onto a carrier signal as contemplated by embodiments of the present invention.

FIG. 2 shows the output of VC01 117 during the harmonic avoidance scheme. $F_{saw(min)}$ and $F_{saw(max)}$ represent the minimum and maximum frequencies allowed to pass through SAW filter 105. Accordingly, all down converted carriers frequencies should be controlled to fall within this range. Further, embodiments of the present invention contemplate keeping, for example, $F_{min}$ apart from $F_{saw(min)}$ because of the relatively fast roll off of signal strength near the edges of the SAW filter's cut off frequencies. Using the sweep generated by the demodulation control, VCO1 117 sweeps through its controlled frequency range $F_{min}$ to $F_{max}$. As shown here, the harmonic frequency $f_{harmonic}$ is close to the actual down converted carrier frequency $F_{lock-int}$. Accordingly, while the carrier recovery loop with VCO1 may, as shown here, or may not actually lock onto the down converted carrier signal, the closeness of the harmonic frequency to the carrier frequency may disrupt the operation of the carrier recovery loop. In the example of FIG. 2, the carrier recovery loop looses lock at time $t_D$. When this occurs (or when the carrier recovery loop cannot lock onto the carrier frequency), the microprocessor (or micro controller) 122 alters the synthesizer's down converting frequency from $f_{synth}$ to $f$synth–$\delta_f$. In this regard, the carrier recovery loop starts sweeping for the carrier using shorter intervals at time $t_D$. At sweep time $t_f$, the final lock is achieved onto the down converted carrier frequency.

Using this procedure, the carrier recovery loop will eventually lock and a true/false lock decision is made by the controller or by the microprocessor. If the lock is not onto the proper carrier (for example, a false lock onto an alternate phase of the carrier), then the system breaks lock until the correct lock is achieved. The true/false lock determination is described in greater detail in U.S. Pat. No. 5,699,585, entitled "Method And Apparatus For Locating And Tracking A QPSK Carrier" which is a continuation of U.S. Ser. No. 08/160,839, entitled "Method And Apparatus For Locating And Tracking A QPSK Carrier", now abandoned, which is incorporated by reference for all necessary disclosure.

As shown in FIG. 2, the forming and breaking of lock is shown as the frequency $F_{lock-int}$. The present invention contemplates that the frequency sweep range (from $F_{min}$ to $F_{max}$) to be larger than the expected LNA offset plus the synthesizer resolution step. Also, embodiments of the present invention contemplate baseband LPF should not distort the spectrum of the signal. Also, for noise reduction purposes, embodiments of the present invention contemplate separating $F_{min}$ and $F_{max}$ from the offsets ($F_{saw(min)}$ and $F_{saw(max)}$) of the SAW filter because of signal degradation near these cut off frequencies. Therefore, the system offers enough clearance from the distortion at $F_{saw(min)}$ and $F_{saw(max)}$ so as to accommodate the sweep and the lock of the carrier recovery loop even at the extreme of the sweep cycle.

As noted in FIG. 2, the shifted carrier frequency is adjusted so as to be as far away from degrading frequencies as possible. In this case, the carrier frequency is adjusted to be equally between the harmonic frequency Fharmonic and one of the frequencies of SAW filter $F_{saw(min)}$. For the example of FIG. 2, $F_{saw(min)}$ is preferable to move to as the harmonic is closer to $F_{saw(max)}$ that $F_{saw(min)}$. In another example, the $F_{lock-final}$ frequency is moved in the direction of $F_{saw(max)}$ to avoid a harmonic closer to $F_{saw(min)}$. In yet another example as shown in FIG. 3, the $F_{harmonic}$ frequency and at least one of the $F_{min}$ and $F_{max}$ frequencies are used to place the $F_{lock-final}$ frequency. It should be noted that the frequencies in which to avoid are those containing degrading characteristics. In the above examples, the frequency of $F_{min}$ was chosen over the frequency $F_{saw(min)}$ in one example (and reversed in another example) as determining which set of frequencies to use is system specific as to avoid noisy frequencies. For instance, if $F_{saw(min)}$ was far from $F_{min}$, then present embodiments of the invention contemplate $F_{min}$ as the lower frequency limit as moving too far in the direction of $F_{saw(min)}$ may extend $F_{final-lock}$ below $F_{min}$. The same process is readily applied to the upper frequencies as well.

It should be noted that the selection of the number of type A and type B sweep cycles as contemplated by embodiments of the present invention are shown here, by example, near a one to one correspondence. Embodiments of the present invention additionally contemplate multiple versions of each. For example, another example includes four wide searches to a single narrow search.

FIG. 3 shows a flowchart as contemplated by embodiments of the present invention, in which two frequency shifting operations are performed. At step 401, based on the system's configuration, the system determines whether a harmonic is present which may disrupt carrier recovery operations. The system determines whether a detrimental harmonic is present through manual entry of values or through automatic detection. As to manual entry, a user enters the different symbol rates used during the demodulation process. The system uses these values to calculate the various harmonics associated with the entered rates. Based on these calculated values, the system makes its determination of how much to offset the carrier for improved reception and demodulation. As to the automated determination of the harmonic frequencies, the system preferably monitors the frequency sweep range without an input carrier and determines the frequency of the noisiest signal. This signal is then labeled as a harmonic and its frequency used by the system when it makes its determination of how much to offset the carrier for improved reception and demodulation.

Figure 5:
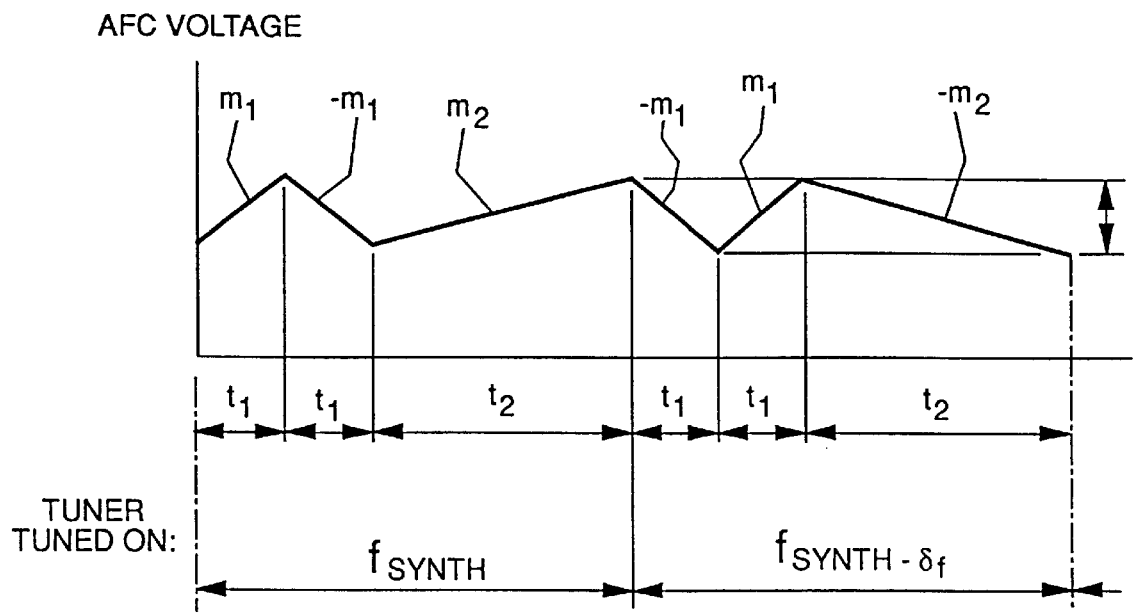
FIGS. 4 and 5 show signal diagrams as contemplated by embodiments of the present invention.
Figure 4:
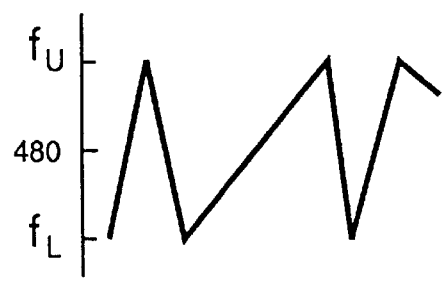

If there is no carrier, the system (for example, an integrated receiver-decoder) locks onto the down converted carrier using regular procedures as shown above with respect to FIG. 1, as shown by step 402. If there is a harmonic signal present, then the system determines (for example, through a sensing operation of microprocessor 122 or through manual input of symbol rates and/or internal clock frequencies) the frequency of the harmonic (or harmonics, as the case may be). The system next attempts to lock the carrier recovery unit onto the carrier signal at step 404. To do this, the tuner is controlled to sweep in the wide fast/slow sweep using alternating frequency offsets. Here, the frequency offset is 250 kHz. FIG. 4 shows the wide fast/slow sweep pattern centered about, for example 480 MHz. An example of the 250 kHz offset applied is shown in FIG. 5 by the inclusion of $\delta_f$ in one cycle. After a certain point in time, the VCO1 117 should be locked onto the carrier, albeit possibly near the harmonic frequency. Next, at step 405, the frequency of the VCO1 is read through divider 123.

The next portion of the carrier locking scheme as shown in FIG. 3 relates to separating the carrier's down converted frequency from the harmonic frequency. As shown in step 406, the scheme determines if the harmonic frequency is above or below the IF (down converted) carrier frequency (e.g., 480 MHz). Through the equations at steps 407 and 409 or through the equations at steps 408 and 410, the center frequency for the narrow sweep as shown through time periods $t_D$ through $t_J$ in FIG. 2 is determined. It should be noted that, in this example, the frequency of the synthesizer is placed above that of the received signals. If, however, one desired to have the frequency of the synthesizer placed below that of the received signals, the equations used would be similar but with minor modifications as apparent to one of ordinary skill in the art.

Next, new frequency of the synthesizer 107 is determined as offset from the original frequency by $f_{off}$ as shown in step 411. The scheme sweeps for a number of cycles as shown in step 412. Here, for example, the number of sweeps is 4. This number is adjusted to account for any transient signals which may occur so as to maximize the chances for a new lock at the newly adjusted carrier frequency. At step 413, the system determines whether the carrier recovery loop has locked. If yes, then as shown in step 414, the scheme determines if this is a proper lock, far from any problems (for example, locking on an out of phase false carrier or excessive error signals). If this is a good lock as determined in step 415, then the scheme loops back to step 414 to continue to monitor the quality of the lock. If not a good lock, the scheme loops back to step 412 until the limit on the number of sweep cycles is reached. From step 413, if no lock is found, then the system changes back to the wide sweep back at the original carrier down converted frequency shown here, for example, as the sweep centered at 480 MHz with a +/−3 MHz sweep.

It should be noted that in the advent of multiple harmonic frequencies, there is less freedom for repositioning the carrier. Accordingly, the present invention contemplates using the above steps to reposition the above carrier in between the multiple harmonic frequencies to assure proper lock and decoding.

While particular embodiments of the present invention have been described and illustrated, it should be understood that the invention is not limited thereto since modifications may be made by persons skilled in the art. The present application contemplates any and all modifications that fall within the spirit and scope of the underlying invention disclosed and claimed herein.

What is claimed is:

1. A demodulator including a recovery loop in which a harmonic signal at a harmonic frequency disrupts reception of a carrier signal comprising:

an input for receiving a carrier signal at a carrier frequency modulated with a data signal;

a frequency generator for generating a signal at a first frequency;

a converter for converting the carrier signal at the carrier frequency to a lower frequency in response to said signal from said frequency generator;

a controller for controlling said frequency generator;

a locking circuit for locking onto said lower frequency;

wherein said controller controls said frequency generator to generate said signal at a second frequency offset from said first frequency so that the lower frequency from said converter is further separated from the harmonic frequency.

2. The demodulator according to claim 1, wherein said controller determines how close the harmonic frequency is to said down converted carrier frequency.

3. The demodulator according to claim 1, wherein said locking circuit uses two different sweep times for locking onto said carrier.

4. The demodulator according to claim 1, wherein the disruption of reception of the carrier signal by the harmonic signal is disruption of carrier signal capture.

5. The demodulator according to claim 1, wherein the disruption of reception of the carrier signal by the harmonic signal is disruption of carrier signal tracking.

6. The demodulator according to claim 3, where the sweep is performed at two different center frequencies.

7. The demodulator according to claim 3, where the sweep has two different slopes.

8. A method of controlling a synthesizer so as to avoid interference comprising the steps of:

Determining an offset frequency value by which to offset a down converted carrier frequency;

locking on to said down converted carrier frequency, said locking performed in conjunction with a wide sweep of a frequency band containing said down converted carrier frequency; and tuning said synthesizer to offset the down converted carrier frequency by the offset frequency value so as to avoid the interference.

9. The method of claim 8, wherein said tuning step breaks a lock on said down converted carrier frequency.

10. The method of claim 9, further comprising the step of:

re-locking onto said down converted carrier frequency as offset by the offset frequency value.

11. The method of claim 10, wherein said re-locking step is performed in conjunction with a narrow sweep of a frequency band containing said down converted carrier frequency as offset by the offset frequency value.

12. The method of claim 8, wherein said interference is harmonic interference.

13. A method of controlling a synthesizer so as to avoid interference comprising the steps of:

synthesizing a first frequency for down converting a received carrier signal to a first intermediate frequency;

synthesizing a second frequency offset from the first frequency for down converting the received carrier to a second intermediate frequency; and, alternating between synthesizing the first frequency and synthesizing the second frequency until a demodulator is locked onto one of the received carrier signal at the first intermediate frequency or the received carrier signal at the second intermediate frequency.

14. The method of claim 13, further comprising the step of:

synthesizing a third frequency offset from the first frequency for down converting the received carrier to a third intermediate frequency so that the interference is avoided.

15. The method of claim 13, wherein the interference is harmonic interference.

16. A method of avoiding interference comprising the steps of:

controlling a voltage controlled oscillator to sweep over a wide frequency band for a down converted carrier signal;

detecting the presence of interference in said down converted carrier signal via the presence of a false lock indication;

locking on to said down converted carrier signal;

determining an offset frequency so as to offset the down converted carrier signal;

offsetting the down converted carrier signal by the offset frequency;

controlling said voltage controlled oscillator to sweep over a narrow frequency band for the down converted signal offset by the offset frequency; and locking onto the down converted signal offset by the offset frequency.

* * * * *

UNITED STATES PATENT AND TRADEMARK OFFICE
CERTIFICATE OF CORRECTION

PATENT NO. : 6,148,039
DATED : November 14, 2000
INVENTOR(S) : Coman, et. al.

It is certified that error appears in the above-identified patent and that said Letters Patent is hereby corrected as shown below:

Column 4, Line 44, delete "5,699,585" and insert therefore --5,699,385--

Signed and Sealed this

First Day of May, 2001

Attest:

NICHOLAS P. GODICI

*Attesting Officer*     *Acting Director of the United States Patent and Trademark Office*